United States Patent
Chien et al.

(10) Patent No.: US 10,340,152 B1
(45) Date of Patent: Jul. 2, 2019

(54) MECHANICAL COUPLINGS DESIGNED TO RESOLVE PROCESS CONSTRAINTS

(71) Applicant: TEXAS INSTRUMENTS INCORPORATED, Dallas, TX (US)

(72) Inventors: Yuh-Harng Chien, New Taipei (TW); Hung-Yu Chou, Taipei (TW); Fu-Kang Lee, New Taipei (TW); Steven Alfred Kummerl, Carrollton, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/857,988

(22) Filed: Dec. 29, 2017

(51) Int. Cl.
*H01L 23/495* (2006.01)
*H01L 21/48* (2006.01)

(52) U.S. Cl.
CPC ...... *H01L 21/4825* (2013.01); *H01L 21/4842* (2013.01); *H01L 23/49517* (2013.01); *H01L 23/49548* (2013.01)

(58) Field of Classification Search
None
See application file for complete search history.

(56) References Cited

U.S. PATENT DOCUMENTS

| | | | |
|---|---|---|---|
| 4,994,412 A | 2/1991 | Kalfus et al. | |
| 7,847,391 B2* | 12/2010 | Udompanyavit | H01L 23/49548 257/143 |
| 8,035,221 B2 | 10/2011 | Cruz | |
| 8,193,618 B2 | 6/2012 | Madrid | |
| 8,324,721 B2 | 12/2012 | Udompanyavit et al. | |
| 10,186,354 B2* | 1/2019 | Shinotake | H01C 1/14 |
| 2003/0094707 A1 | 5/2003 | Howarth | |

* cited by examiner

*Primary Examiner* — Chandra Chaudhari
(74) *Attorney, Agent, or Firm* — Dawn Jos; Charles A. Brill; Frank D. Cimino (57) ABSTRACT

An integrated circuit package having a shunt resistor with at least one self-aligning member that protrudes from a first surface, and a lead frame with at least one self-aligning feature that is a cavity within which the at least one self-aligning member is located, and an integrated circuit located on the lead frame.

9 Claims, 8 Drawing Sheets

MECHANICAL COUPLINGS DESIGNED TO RESOLVE PROCESS CONSTRAINTS

BACKGROUND

Semiconductor devices can be used as amplifiers dedicated to current or voltage sensing. The amplifier typically comprises an integrated circuit (IC) package that is typically coupled to a lead frame that is further attached to a shunt resistor to increase area of the circuit board occupied by these elements. Attaching the lead frame to the shunt resistor, however, has proven difficult, as the alignment of the two components can be disrupted during the prior art methods or processes of epoxy or solder attachment. Accordingly, a device and process are needed to minimize the misalignment of the lead frame and the shunt.

SUMMARY

One aspect of the present disclosure provides an integrated circuit package. The package comprises a lead frame, an integrated circuit located on the lead frame and a self-aligning shunt resistor coupled to the lead frame and to the integrated circuit. The shunt resistor coupled to the lead frame through the use of self-aligning members. In one aspect of the disclosure, the shunt has at least two self-aligning members that protrude from a first surface facing the lead frame that extend past a second surface of the lead frame opposite a first surface of the lead frame facing the shunt. In a further aspect of the disclosure, the self-aligning members extend through a self-aligning feature in the lead frame. In still a further aspect of the disclosure, the self-aligning members have at least a portion that extends past the self-aligning feature and has a larger surface area than the self-aligning feature of the lead frame.

In an alternative aspect of the disclosure, the self-aligning members of the shunt extend past a surface of the lead frame facing the shunt. In a further aspect of the disclosure, the self-aligning features cavities forming at least two sidewalls. In a further aspect of the disclosure, the self-aligning members are affixed to the sidewalls of the self-aligning features. In a further aspect of the disclosure, the self-aligning members are affixed to the sidewalls of the self-aligning features by epoxy coupling. In an alternative aspect of the disclosure, the self-aligning members are affixed to the sidewalls of the self-aligning features by solder coupling. In alternative aspects of the disclosure, other methods of affixing the self-aligning members are affixed to the sidewalls of the self-aligning features can be used.

In a further aspect of the disclosure of the package, the shunt has its own integrated external leads. In a further aspect of the disclosure, the package is an amplifier for current or voltage measurements. The amplifier comprises the above-described packages, wherein the shunt has its own external leads, or, has a low-resistance coupling to external leads of the lead frame. A mold encompasses the lead frame, the shunt resistor, and the integrated circuit, except for the integrated external leads of the lead frame or the integrated external leads of the shunt resistor.

Another aspect of the present disclosure is method of manufacturing the above-described integrated circuit packages. The method comprises forming a lead frame, forming self-aligning features in the lead frame, forming a shunt, forming at least two self-members on the shunt. The method further comprises coupling the shunt to the lead frame by inserting the self-aligning members of the shunt into the self-aligning features of the lead frame. The method further comprises forming an outermost surface of at least one self-aligning member having a surface area that is greater than a surface area of the self-aligning feature of the lead frame.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

As part of the present disclosure, it was recognized that prior methods of epoxy and/or solder coupling of a shunt to a lead frame resulted in non-alignment or rotation during the liquid phase of the solder reflow process. Similarly, a shunt can rotate as a result of epoxy coupling to a lead frame.

To prevent such an occurrence, it was found that forming self-aligning members and self-aligning features in the shunt and lead frame, respectively, can alleviate and minimize the rotation that typically occurs with prior methods of coupling the two components.

Figure 1:
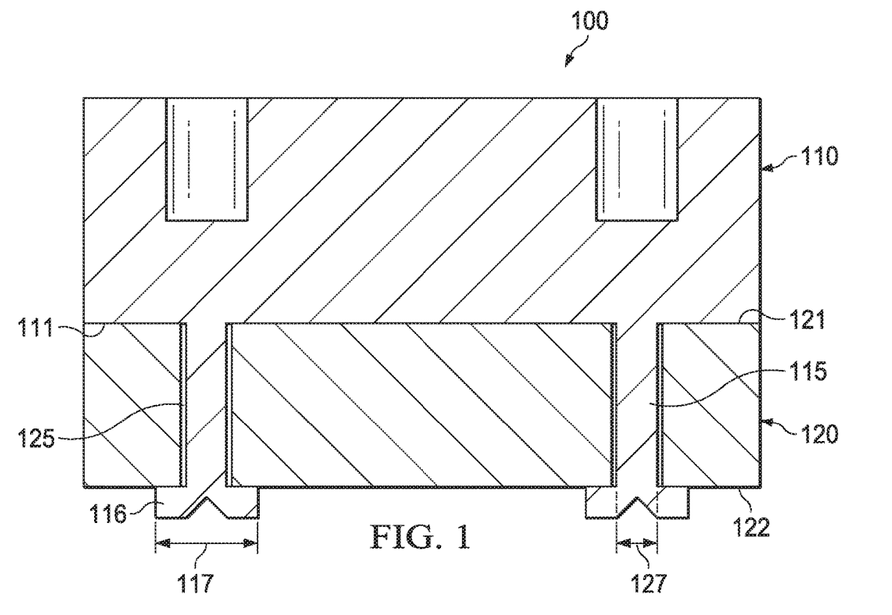
FIG. 1 illustrates an aspect of the disclosure of an integrated circuit package having a shunt and a lead frame are coupled together.

FIG. 1 illustrates an integrated circuit package 100 in accordance with this disclosure. The integrated circuit package 100 has a shunt 110 and a lead frame 120. The shunt has at least one self-aligning member 115 that protrudes from a first surface of the shunt 111 facing the lead frame and extend past a second surface 122 of the lead frame opposite a first surface 121 of the lead frame facing the shunt 121. In the example shown, the two self-aligning members 115 have at least a portion 116 that extends past the self-aligning feature 125 and has a first width 117 that is greater than a second width 127 of the self-aligning feature 125 of the lead frame 120.

Figure 2A:
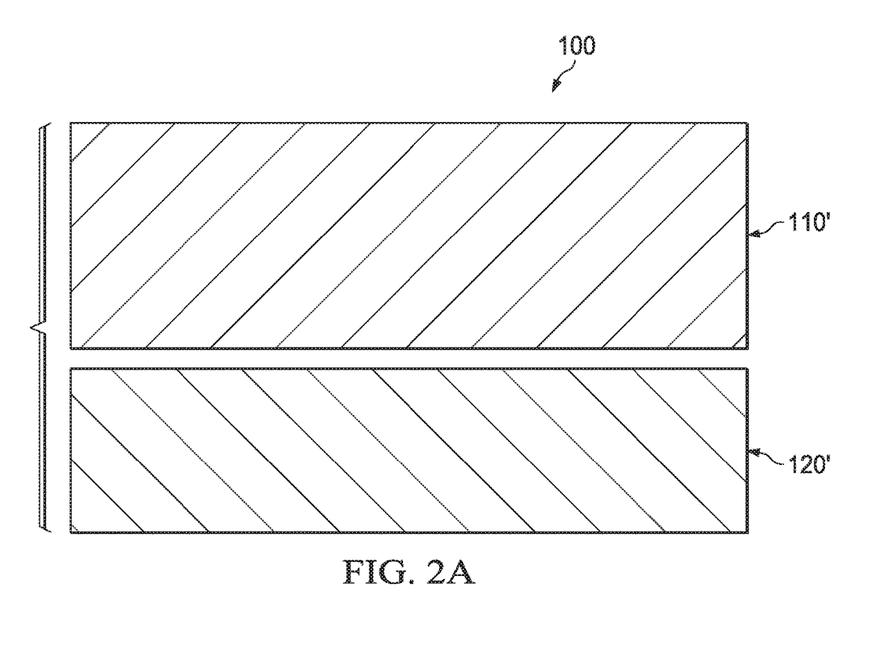
FIGS. 2A-2F illustrate an aspect of the disclosure of fabricating the FIG. 1 integrated circuit package.
Figure 2B:
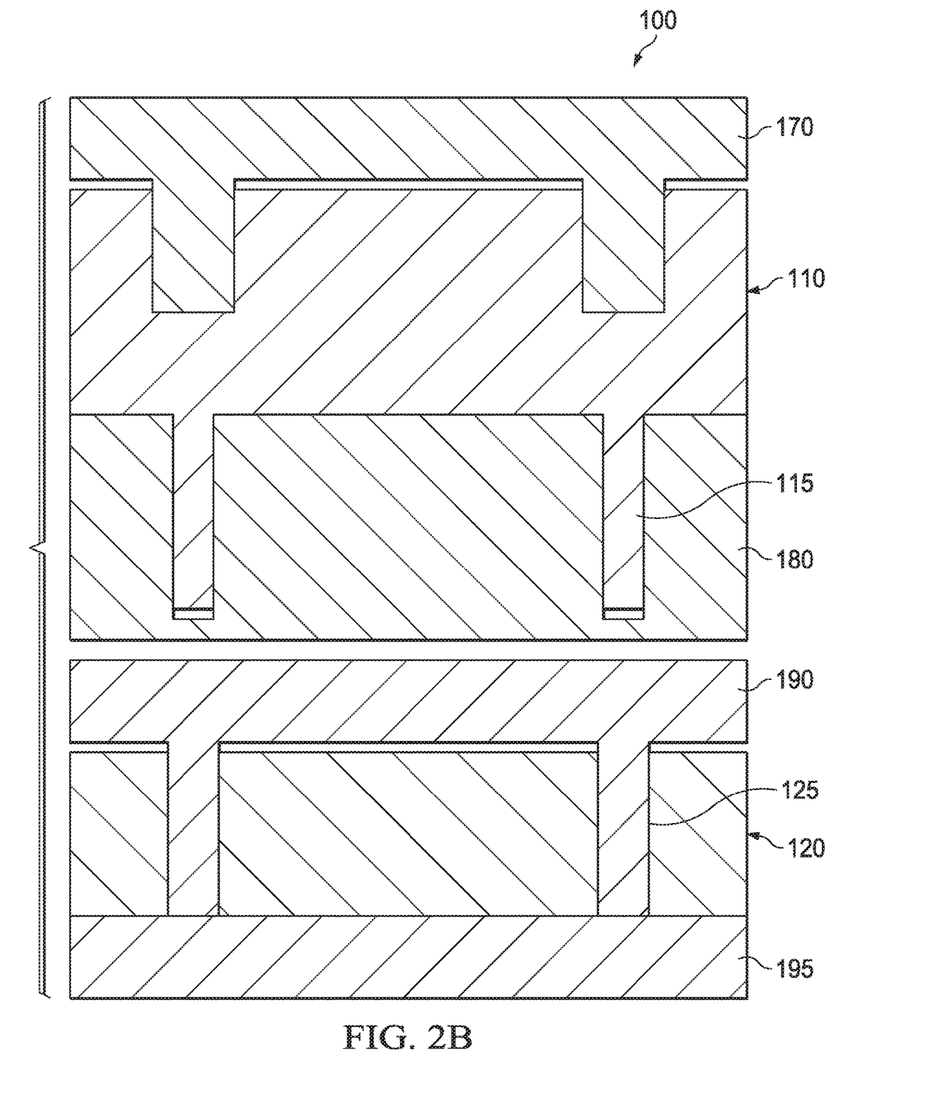

FIGS. 2A-2F show an aspect of the disclosure of fabricating the integrated package 100 of FIG. 1. As illustrated in FIG. 2A, a shunt precursor 110' and a lead frame precursor 120' are both depicted. FIG. 2B shows the formation of self-aligning members 115 protruding from the shunt 110 and the formation of self-aligning features 125 within the lead frame 120. While the self-aligning members 115 is described as being formed from the shunt precursor 110' material, it should be understood that the self-aligning members 115 are not so limited. For example, self-aligning members could be formed of a different material, and can be affixed to a surface of the shunt 111 (FIG. 1) facing the lead frame 120. Alternatively, the self-assembled members could be formed through molding of the shunt in a manner having the self-aligned members. The illustrated self-aligning members 115 of FIG. 2B are made from a punch down tool 170 and a complementary punch up tool 180.

Similarly, the FIG. 2B self-aligning features 125 of the lead frame 120 are illustrated as being formed by a punch down tool 190 and clamp 195. It should be noted that such an example is not limiting. For example, other methods of forming the self-aligning features 125 can be used like conventional etching. Alternatively, the lead frame can be molded to include the self-aligning features upon formation. In the example illustrated, the self-aligning features 125 are shown as through holes, but it should be understood that the illustration is not so limiting. For example, in an alternative example, the self-aligning feature can be a cavity having at least two sidewalls and no through hole. Like the example illustrated in FIG. 2B, these alternative examples can be formed with a punch down tool 190 and a clamp 195, with the difference being the height of the punch down tool (the height being measured from a first surface 121 of the lead frame facing the shunt 110 to the second surface 122 of the lead frame opposite the first surface 121). In the alternative example, the cross-sectional height of the punch down tool would be less than the cross-sectional height of the lead frame within which the cavities would be formed.

Figure 2C:
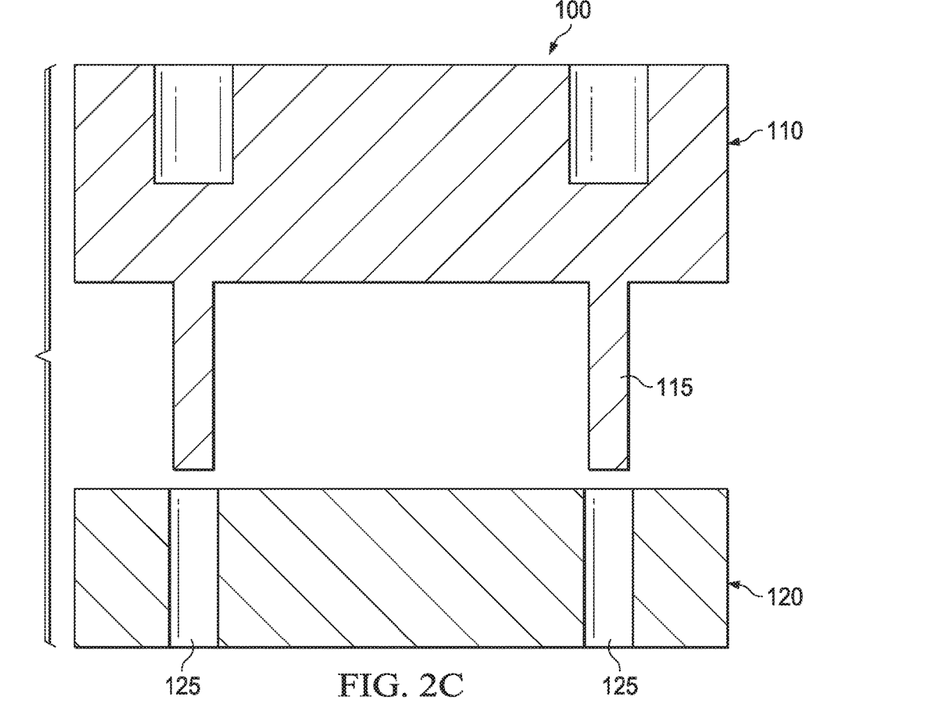

FIG. 2C illustrates the shunt 110 and the lead frame 120 without the punch down and punch up tools 170, 180, 190, and clamp 195.

Figure 2D:
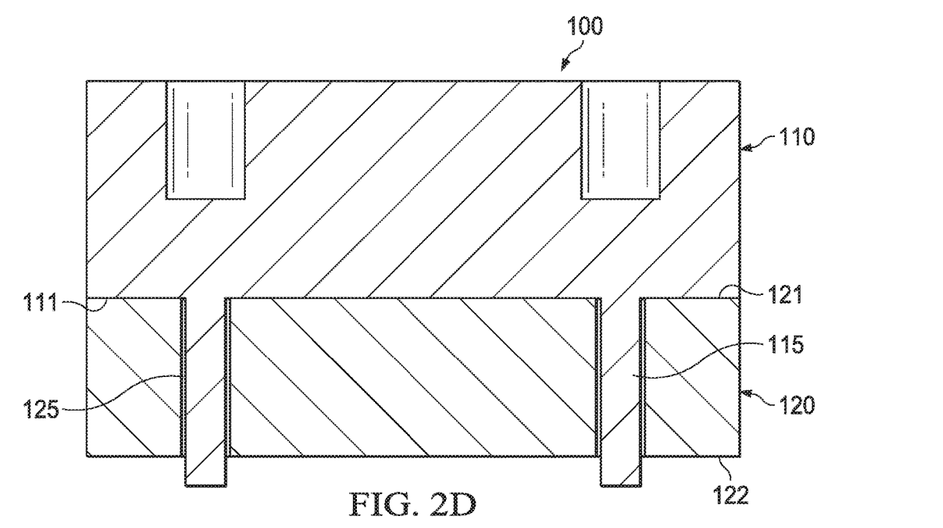

As illustrated in FIG. 2D, the self-aligning members 115 are inserted through the self-aligning features 125 such that they extend past a second surface 122 of the lead frame 120 opposite a first surface 121 of the lead frame facing the shunt. As discussed above, the example is not limiting. For example, the example illustrated in FIG. 2D shows self-aligning features 125 as through holes. As discussed above, the self-aligning features could also be formed as cavities having at least two sidewalls and not having a through hole. The self-aligning members would be complementary in height to the cavities (with the height being measured from a first surface 121 of the lead frame facing the shunt 110 to the second surface 122 of the lead frame opposite the first surface 121). In a further alternative example, the self-aligning members can be affixed to the self-aligning features of the lead frame either by epoxy or solder or some other fastening mechanism.

The insertion of self-aligning members 115 into the self-aligning features 125 minimizes and possibly eliminate any rotation of the shunt 110 relative to the lead frame 120 as with the prior art. Because there are at least two self-aligning members 115 inserted into the self-aligning features 125, any rotation during further processing steps can be minimized and/or eliminated.

Figure 2E:
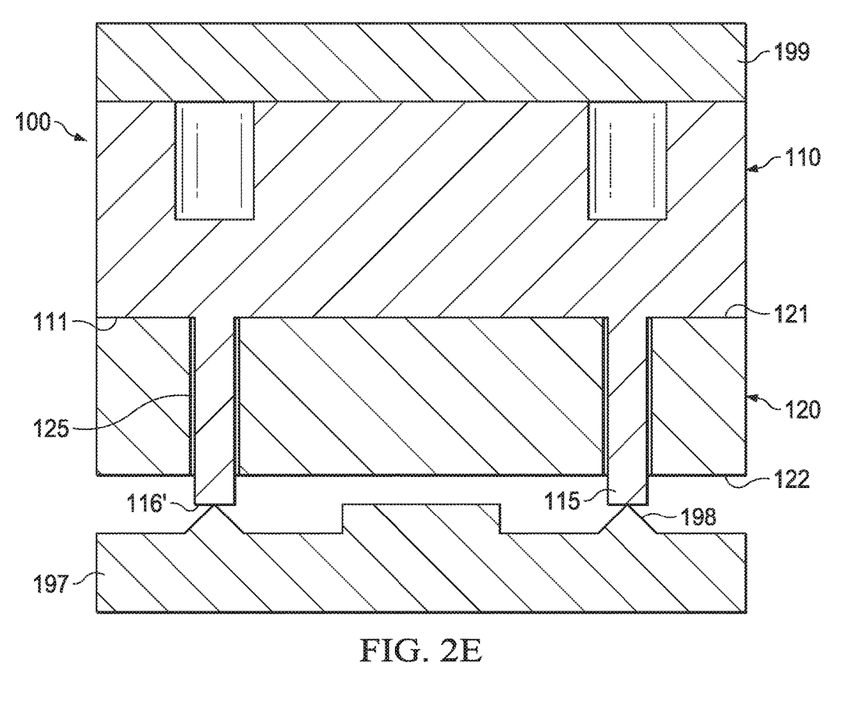

In a further example of the fabrication process illustrated in FIG. 2E, portion 116' of the self-aligning members 115 extend past a second surface 122 of the lead frame 120 that is opposite the first surface 121 of the lead frame 120 that faces the shunt 110. A punch up tool 197 is positioned underneath the lead frame 120 having feet 198 aligned with the self-aligning members 115 extending through the self-aligning features. A clamp 199 is positioned over the shunt 110 to act as a backstop for the impact that the punch up tool 197 would create upon impact on the portions 116' of the self-aligning members 115. The impact of the punch up tool 197 creates portions 116 of the self-aligning members 115 having a larger surface area 117 (FIG. 2F) than the surface area 127 (FIG. 2F) of the opening that forms the self-aligning feature 125 of the lead frame 120. The self-aligning members 115 act as couplings to couple the shunt 110 to the lead frame 120.

Figure 2F:
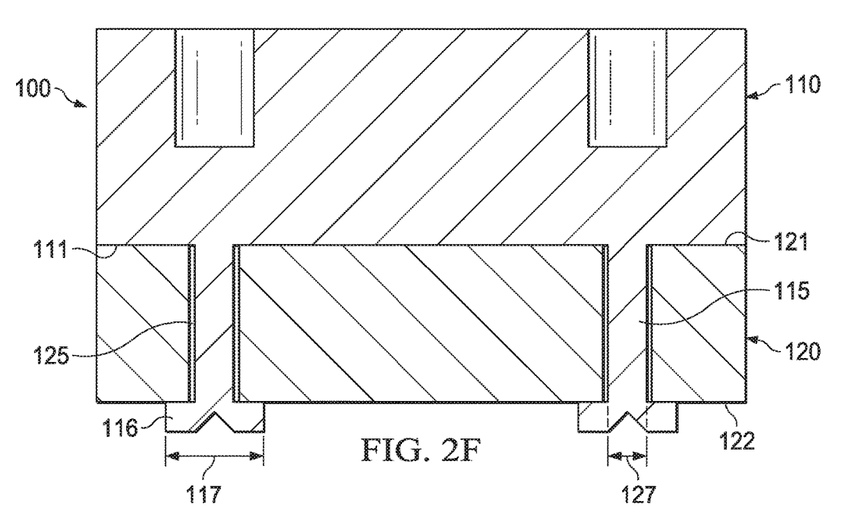

The resulting device is illustrated in FIG. 2F.

By having self-aligning members 115 that mate with self-aligning features 125, the risks of rotation during assembly are minimized by up to 50% relative to prior methods using epoxy or solder coupling. The self-aligning members 115 and self-aligning features 125 allow for interlocking that can also shorten production time by eliminating the time-consuming process of epoxy or solder coupling step, which requires heating, attachment, and cooling of the epoxy or solder used to hold the materials together. In addition, it eliminates the expense of epoxy and solder that are required for prior methods of coupling the shunt to the lead frame.

Figure 3A:
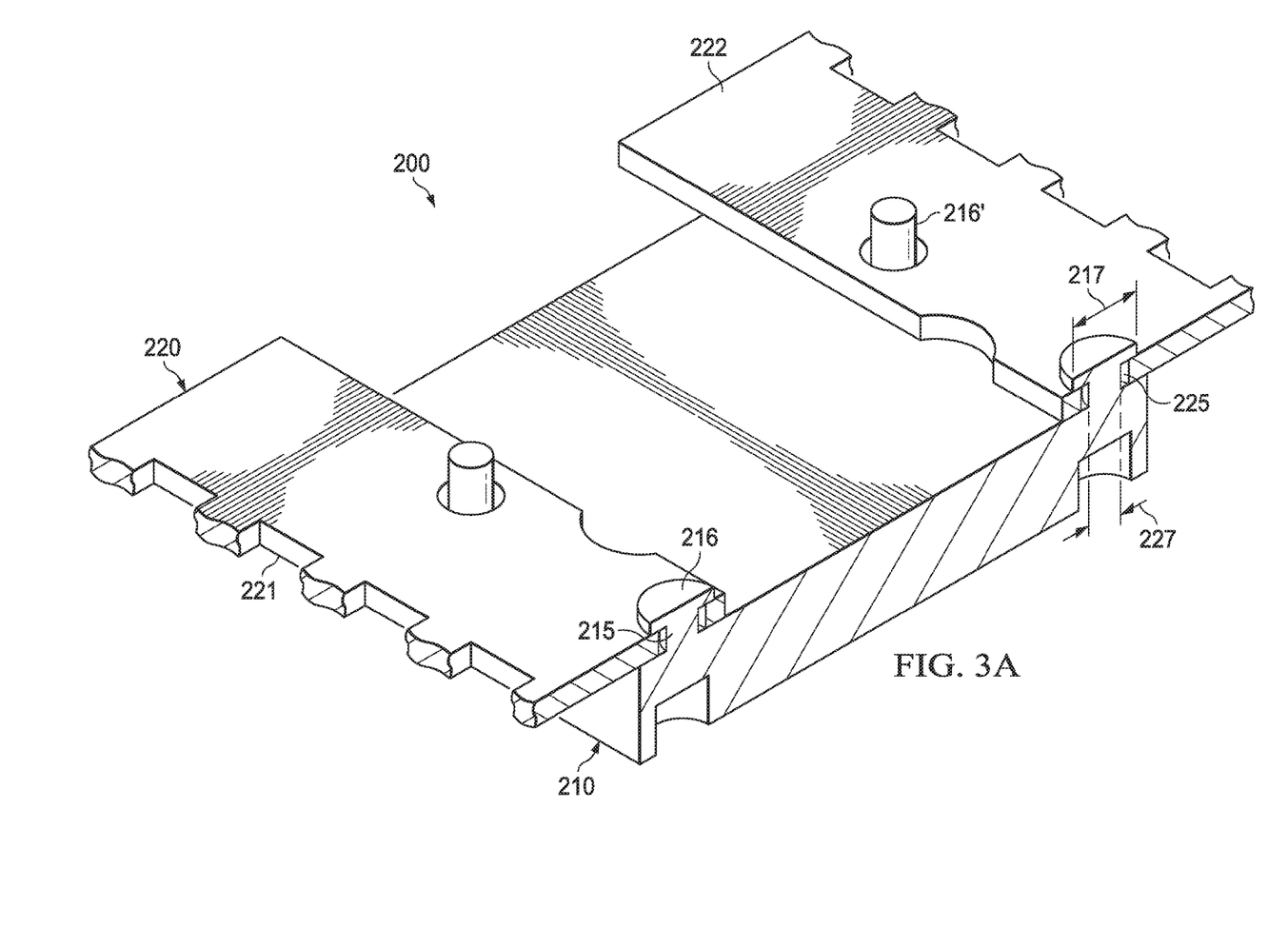
FIGS. 3A-3B illustrates a second aspect of the disclosure of a shunt and a lead frame are coupled together.

In another example depicted in an angled plan view in FIG. 3A, an integrated circuit package 200 has a lead frame 220 placed over a shunt 210. In this example, the shunt has at least four self-aligning members 215 that are shown to extend through the self-aligning features 225 of the second surface 222 of the lead frame 220 opposite the first surface 221 of the lead frame. As illustrated, two portions 216' of two self-aligning members 215 are depicted prior to the punch up tool (197 of FIG. 2E) and clamp (199 of FIG. 2E) have deformed those portions. The other two portions 216 of two self-aligning members 215 are depicted after the punch up tool (197 of FIG. 2E) and clamp (199 of FIG. 2E) have deformed those portions. As illustrated, those portions 216 have larger surface areas 217 than the surface areas 227 of the self-aligning feature 225 of the lead frame 220. In the example illustrated, the surface areas 217 and 227 are equivalent to the circular diameters (as measured from a top plan view of FIGS. 3A and 3B) of portions 216 of the self-aligning members 215 and the self-aligning features 225, respectively. It should be noted that this is not intended to be limiting. For example, the surface areas 217 and 227 could have a top plan view shape of a rectangle, triangle, or some other shape.

Figure 3B:
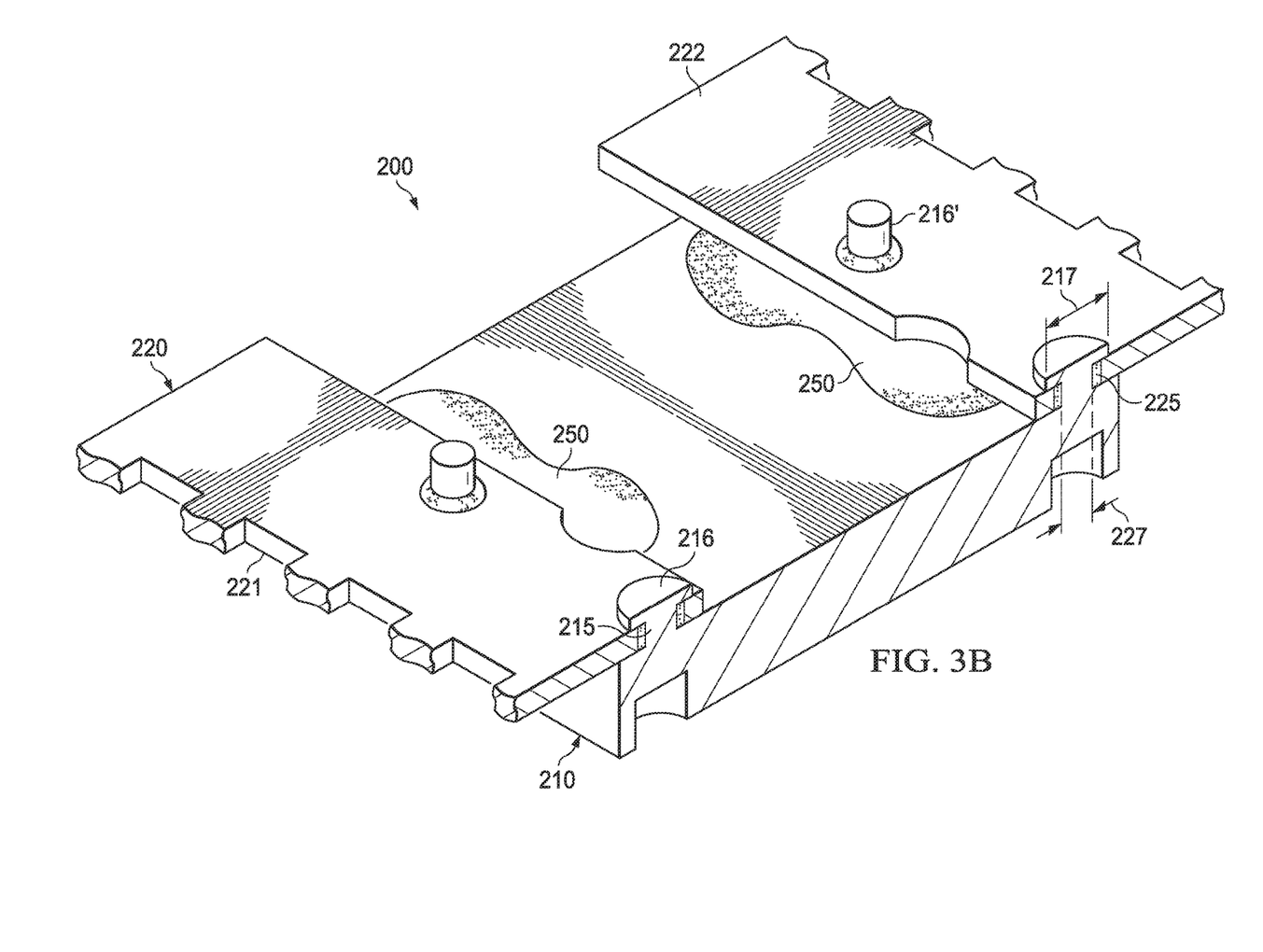

FIG. 3B illustrates a further aspect of the disclosure in which a conductive paste 250 is placed on the shunt 210 or lead frame 220. After coupling, conductive paste 250 can fill any mechanical gaps between the shunt 210 and lead frame 220. This can enhance the electrical and thermal conductivity of the device.

Figure 4:
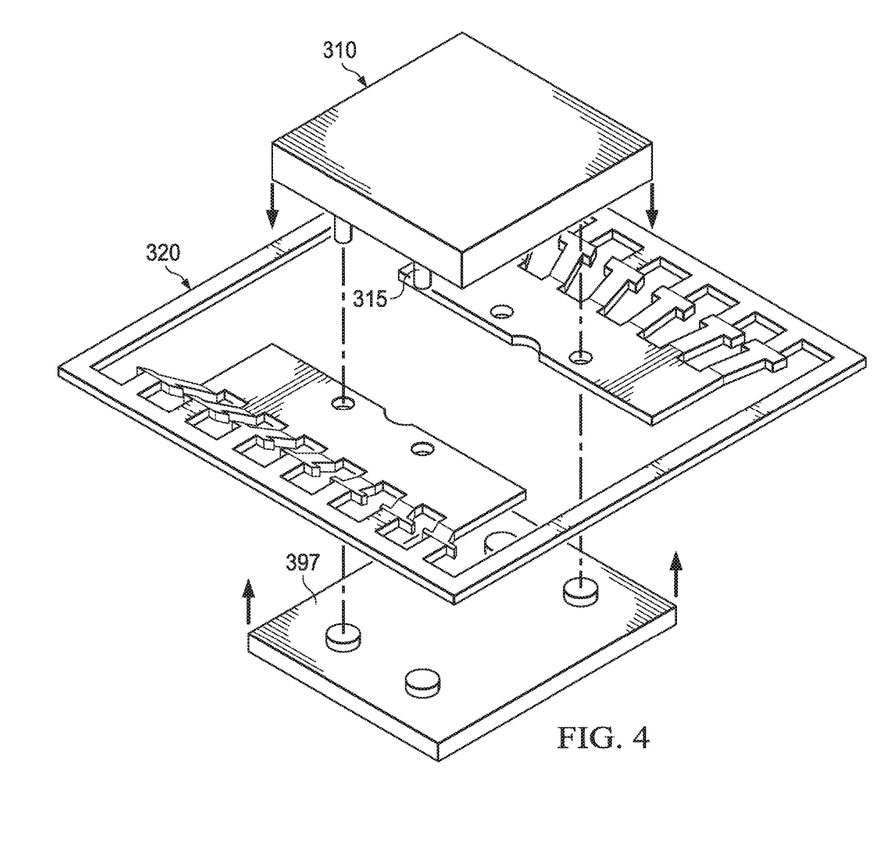
FIG. 4 illustrates a precursor of the FIG. 3A/3B device.

FIG. 4 illustrates a blown-apart depiction of a shunt 310 over a lead frame 320 with a punch up tool 397. In this example, the shunt 310 has four self-aligning members 315 (only two of which are illustrated). The self-aligning members 315 are shown prior to their deformation by the punch up tool 397. It should be noted that once the punch up tool 397 is removed, an integrated circuit can be coupled to the lead frame. Alternatively, an integrated circuit can be seated on the lead frame prior to the punch up tool 397 step.

Figure 5A:
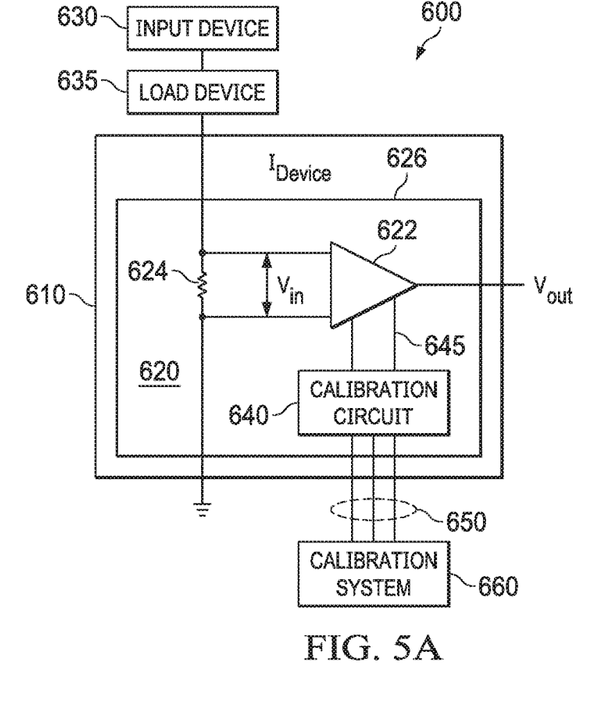
FIGS. 5A-5B illustrate block diagrams of another aspect of the present disclosure of an amplifier having an integrated circuit package having a shunt and a lead frame are coupled together.
Figure 5B:
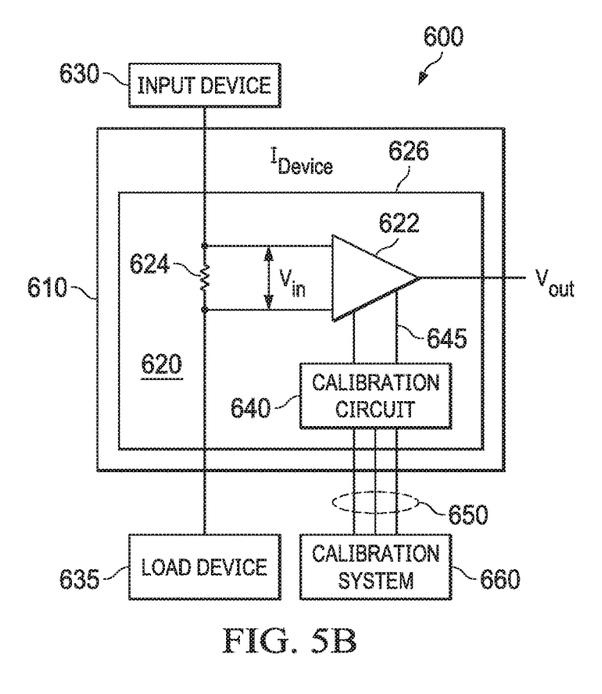

FIGS. 5A and 5B illustrate block diagrams of another aspect of the present disclosure. An amplifier 600 for current or voltage measurements comprises an IC package 610. The package 610 can be any of the above-described examples of the IC packages. The package 610 includes a lead frame 620, IC 622 on the lead frame 620, and shunt resistor 624. The shunt resistance 624 is coupled to the lead frame 620 (as discussed above) and electrically connected to the IC 622. The lead frame 620 and shunt resistor 624 are coupled together through self-aligning members and self-aligning features as described above with respect to FIGS. 1-4. The shunt resistor 624 can have its own external leads, or, has a low-resistance coupling to external leads of the lead frame. Additionally, the package 610 includes a mold 626 that encompasses the lead frame 620, shunt resistor 624, and IC 622, except for the external leads of lead frame 620 or shunt resistor 624.

One of ordinary skill in the art would be familiar with various possible configurations the amplifier 600 could have to facilitate a current- or voltage-sensing function. For example, the shunt resistor 624 can be coupled via its own external leads, or, via external leads of the lead frame 620, to an input device 630 and to a load device 635. FIG. 5A presents a low-side sensing configuration. FIG. 5B presents a high-side sensing configuration. One skilled in the art would appreciate the other sensing configurations that could be used. In some examples, to measure the current ($I_{device}$) passing through the input device 630, the voltage potential drop ($V_{in}$) across the shunt resistor 624, is read as an input to the IC 622, to produce an output voltage ($V_{out}$) from which $I_{device}$ can be calculated.

The amplifier 600 can further comprise additional components to facilitate the measurement of current or voltage. For example, the amplifier 600 can also include a calibration circuit 640 that is electrically connected to the IC 622. The calibration circuit 640 can also be encompassed by the mold 626, or, can be external to the mold 626. The calibration circuit 640 can be configured to facilitate adjustment of the gain of the amplifier IC 622, using procedures well known to those skilled in the art. E.g., the calibration circuit 640 can include a network of parallel resistors, each resistor having a different value in a desired range governed by design considerations. In some examples, the parallel resistors of the calibration circuit 640 comprise the same low TCR material used to form the shunt resistor 624, or, in other cases is included in other topological configurations. The calibration circuit 640 can be connected via conventional input/output lead 645 to the IC 622, and via a data bus 650, to a conventional calibration system 660 that is external to the package 610.

The above discussion is meant to be illustrative of the principles and various examples of the present invention. Numerous variations and modifications will become apparent to those skilled in the art once the above disclosure is fully appreciated. For example, it should be noted that the lead frame could include an epoxy or solder coupling in addition to the self-aligning members and self-aligning features that couple the shunt to the lead frame. It should also be noted that the shunt and/or lead frame can be made of a material having a high temperature co-efficient of resistivity (TCR). It should also be noted that while certain examples above have been illustrated as a quad flat no-lead package (QFN), other conventional type of lead-containing package, including plastic dual in-line integrated circuit packages (PDIP), small outline integrated circuits (SOICs), quad flat packages (QFP), thin QFPs (TQFPs), low profile QFPs (LPQFPs), Small Shrink Outline Plastic packages (SSOP), thin SSOPs (TSSOPs), thin very small-outline packages (TVSOPs), or other packages well known to those skilled in the art. It should also be noted that other layers not shown can be included in the packages described above. In addition, it should be understood that other components including bonding wires, mounting pads, tie bars, and other components can be included in the examples described above.

It is intended that the following claims be interpreted to embrace all such variations and modifications.

What is claimed is:

1. An integrated circuit package, comprising:
   a shunt resistor having at least one self-aligning member that protrudes from a first surface of the shunt resistor; and
   a lead frame having at least one self-aligning feature, wherein the self-aligning feature is a cavity extending from a first surface of the lead frame facing the first surface of the shunt resistor and the at least one self-aligning member is located within the cavity that form the at least one self-aligning feature; and
   an integrated circuit located on said lead frame.

2. The integrated circuit package of claim 1, wherein the cavity is a through hole that extends from the first side of the lead frame through a second side of the lead frame that is opposite the first side of the lead frame.

3. The integrated circuit package of claim 2, wherein an outermost surface of the at least one self-aligning member has a surface area that is greater than a surface area of the self-aligning feature of the lead frame.

4. The integrated circuit package of claim 1, wherein the at least one self-aligning member is affixed to the self-aligning feature of the lead frame by solder coupling.

5. The integrated circuit package of claim 1, wherein the shunt resistor has at least four self-aligning members.

6. An amplifier comprising:
   an integrated circuit package comprising:
   a shunt resistor having at least two self-aligning members, each self-aligning member being formed from the shunt resistor material and as protrusions from a first surface of the shunt resistor; and
   a lead frame having at two least self-aligning features, wherein the self-aligning features are through holes extending from a first surface of the lead frame facing the first surface of the shunt resistor through a second surface of the lead frame opposite the first surface,
   wherein each of the at least two self-aligning members are located within and through a respective self-aligning feature; and
   an integrated circuit located on said lead frame.

7. The amplifier of claim 6, wherein at least a portion of at least one of the self-aligning members that extends past the self-aligning feature has a larger surface area than a surface area of the self-aligning feature of the lead frame.

8. The amplifier of claim 6, wherein each of the at least two self-aligning members are affixed to the self-aligning features of the lead frame by solder coupling.

9. The amplifier of claim 6, wherein the shunt resistor has at least four self-aligning members.

* * * * *